United States Patent [19]

Slavicek

[11] Patent Number: 4,621,486
[45] Date of Patent: Nov. 11, 1986

[54] APPARATUS FOR MAKING A TAPE CARRIER

[75] Inventor: Donald Slavicek, Lombard, Ill.

[73] Assignee: Molex Incorporated, Lisle, Ill.

[21] Appl. No.: 795,048

[22] Filed: Nov. 4, 1985

Related U.S. Application Data

[62] Division of Ser. No. 671,397, Nov. 15, 1984, abandoned.

[51] Int. Cl.⁴ .............................................. B65B 11/00
[52] U.S. Cl. ........................................ 53/580; 53/491;
156/510; 206/330; 206/345
[58] Field of Search ................ 53/397, 399, 409, 580,
53/589, 591, 594; 156/510, 516, 250; 206/330,
343, 345, 344; 493/466

[56] References Cited

U.S. PATENT DOCUMENTS 3,091,835  6/1963  Weiss .................................. 206/330
3,231,082  1/1966  Weiss .................................. 53/397
3,698,551 10/1972  Tomlinson .......................... 53/397
3,885,373  5/1975  Place et al. ......................... 53/580

FOREIGN PATENT DOCUMENTS 2535393  2/1977  Fed. Rep. of Germany ........ 53/594
 844857  8/1960  United Kingdom .................. 53/580

Primary Examiner—John Sipos
Assistant Examiner—Donald R. Studebaker
Attorney, Agent, or Firm—Louis A. Hecht

[57] ABSTRACT

Disclosed is a flexible substrate assembly including an elongated flexible substrate having a plurality of spaced apart component receiving regions, with a solid component disposed on each of said regions. A plurality of flexible strap members are disposed adjacent each component receiving region on one side thereof, and are joined to the other side of the region such that the strap overlies the region to form a tube-like passageway for receiving and containing a solid component. Several embodiments of the invention include different configurations of strap members are punched out from the flexible substrate so as to form a flap-like member having a free end, which is joined to the substrate so as to form a tube-like passageway. Also disclosed are methods for fabricating the substrate assembly and dispensing solid components contained in the substrate assemblies. Also, packaging arrangements and apparatus to produce packaging arrangements including the flexible substrate assemblies are also disclosed.

3 Claims, 12 Drawing Figures

APPARATUS FOR MAKING A TAPE CARRIER

This application is a division of application Ser. No. 671,397, filed Nov. 15, 1984 now abandoned.

BACKGROUND OF THE INVENTION

The present invention is directed to the packaging of solid components in a flexible substrate assembly having tube-like passageways each containing a solid component. The present invention is also directed to an article of manufacture comprising an elongated sheet of flexible substrate material, having component receiving portions for carrying a plurality of solid components, with strap-like means disposed adjacent the component receiving portions and joined to the carrier substrate so as to form a tube-like passageway for containing a solid component. The ends of the passageways can be closed to provide a substantially enclosed containment of the solid components. Also, the present invention is directed to folding or bending the substrate assembly (having a plurality of solid components secured thereto) in a boustrophedon pattern, or winding the flexible substrate material onto a reel, for transport.

The invention is also directed to a packaging system for electrical connectors having rigid pin-like terminal means projecting therefrom. Prior to their disposition in the tube-like passageways mentioned above, the components are provided with a rigid spacer which is disposed adjacent the pin-like projections to prevent damage to those projections or to prevent the projections from piercing or otherwise disturbing the flexible carrier.

In the past, solid components such as electrical connectors have been packaged in bulk by filling a plastic bag or other suitable container with a number of components in contact with each other in a random manner. However, bulk packaging is unsuitable in many applications since the solid components are subjected to damage during transport. Another more time consuming and expensive method of packaging electrical connectors has been performed by manually aligning the connectors in layers in a suitable container (such as a cardboard box), to minimize contact between the connectors during storage. A layer of compressible material is sometimes disposed between each layer of hand packed components to minimize damage to them during transport. In yet another method, solid members are disposed end-to-end in a plastic tube, but this method is relatively expensive compared to the installed cost of the solid components being packaged.

The assignee of this application has described still another method in U.S. patent application Ser. No. 597,637 filed Apr. 6, 1984. In this method, connectors or other electrical components having a plurality of rigid pin-like projections are mounted for transport by inserting the pin like projections in a carrier member which is typically comprised of a polymeric foam or the like material. However, this carrier material comprises a porous medium which readily accepts and retains certain contaminants which tend to deteriorate the electrical contact quality of the rigid pin-like projections, which comprise, for example integrated circuit terminals.

Further, with increasing miniaturization of electrical components, and the related to requirements of more exacting conductive properties of electrical terminals, insertion and withdrawal of the terminals into a porous carrier presents a significant risk of damage or deterioration to those terminals.

Accordingly, it is an object of the present invention to provide an apparatus for making a tape-like carrier comprising a flexible substrate assembly for carrying a plurality of solid components.

These and other objects of the present invention are provided in an apparatus for making a flexible substrate assembly which includes an elongated flexible substrate having a plurality of spaced-apart component-receiving regions, a plurality of solid components disposed on the substrate, one on each region, and a plurality of pairs of aligned spaced-apart generally longitudinally extending slits, each defining flexible strap means having one end adjacent each region on one side thereof and a second end adjacent the opposite side of said region, integrally joined by a connecting portion overlying the region to form a tube-like passageway for receiving and containing the components, The apparatus comprises a workstation whereat the assembly is made, means for presenting the substrate to the workstation, means for cutting the substrate to form the strap means, means for lifting the strap means from the substrate to form a component-receiving passageway, and means for inserting the component between the strap means and the substrate.

In one embodiment of the present invention, the strap means is struck out from the substrate to have a free end. After the strap means is lifted to allow insertion of a component thereunder, the free end is joined to the substrate to form a tube-like passageway. In one embodiment, the opening formed by striking out the strap means extends along the component-receiving passageway. In this embodiment, the strap means includes enlarged ear portions which are joined onto the substrate on either side of the opening. In another embodiment, the strap means has a free end, and is bent back to overlie a component receiving passageway longitudinally adjacent to the opening. Again, the free end of strap means is joined to the substrate to form the tube-like passageway.

In another embodiment of the present invention, the cutting means forms a pair of spaced-apart slits in the substrate such that the first and second ends of the strap means are integrally joined to the substrate. The strap lifting means is operative to displace the strap means, and the remaining portions of the substrate laterally adjacent the slits, away from each other, to form a tube-like passageway.

BRIEF DESCRIPTION OF THE DRAWINGS

The above and other objects and advantages of the present invention will become apparent with reference to the drawings, with like elements are referenced alike, wherein.

DETAILED DESCRIPTION OF THE PREFERRED EMBODIMENTS

Figure 1:
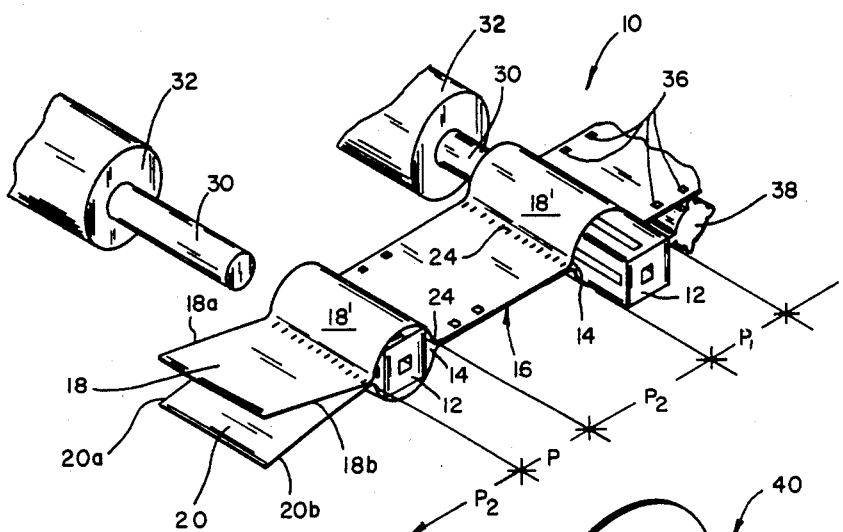
FIG. 1 is a perspective view of a flexible substrate assembly according to the invention, shown with an actuator arm for ejecting a solid component from the substrate assembly.

Turning now to the drawings, and particularly to FIG. 1, a flexible substrate assembly 10 containing a plurality of solid components such as electrical connectors, or housings for electrical components or the like, designated generally by reference numeral 12. Components 12 are contained within tubular passageways 14 formed in the double layer laminated flexible substrate carrier portion 16 of assembly 10. Carrier 16 is formed of two aligned, continuous flexible sheets 18, 20 which have parallel overlying edges 18a, 20a and 18b, 20b. Sheets 18, 20 may be formed of any flexible material such as mylar, polyethylene, or polyvinyl chorlide. Sheets 18, 20 are joined to each other along seam lines 24 arranged on either side of the passageway 14. Seams 24 are formed by joining aligned pairs of opposed component receiving region end portions using any convenient method, such as heat sealing or adhesives, but preferably by using conventional ultrasonic welding techniques. In its fully fabricated form, substrate assembly 10 is comprised of an alternating series of first and second portions P1 and P2 respectively, the first component receiving portions P1 containing the tubular passageways and the second spacer portions P2 containing the remainder of the assembly located between those passageways. With reference to the lower substrate 20, the substrate is comprised of an alternating succession of first and second portions (aligned with P1, P2, respectively) wherein components 12 are disposed on component receiving portions P1. The portions 18' of upper sheet 18 comprise flexible straps which are disposed adjacent portions P1 having ends joined along seams 24 to lower sheet 20, to form the completion of tubular passageways 14. It will be readily appreciated that although sheet 18 is shown as having a width identical to the width of lower sheet 20, sheet 18 could be narrower than sheet 20 and could be aligned to the center or to either side of that sheet.

Also shown in FIG. 1 are actuator arms 30 which comprise, for example, armatures of solenoids 32 which are located adjacent one side of substrate assembly 10. Substrate assembly 10 includes a plurality of indexing apertures 36 which engage the teeth of a drive wheel 38, to provide precise linear advancement of assembly 10. Apertures 36 could be replaced by notches formed by lancing an edge of sheet 20 to form indexing flaps which are thereafter drifted to displace the flaps from the plane of sheet 20. Substrate assembly 10 is readily and accurately indexed so that tubular passageway 14 is aligned with actuator arm 30, whereupon actuator arm 30 is extended to enter passageway 14, thereby displacing and ejecting component 12. It can be seen that the arrangement of the present invention readily provides an accurate placement of a continuous succession of predeterminedly oriented solid members.

Figure 2:
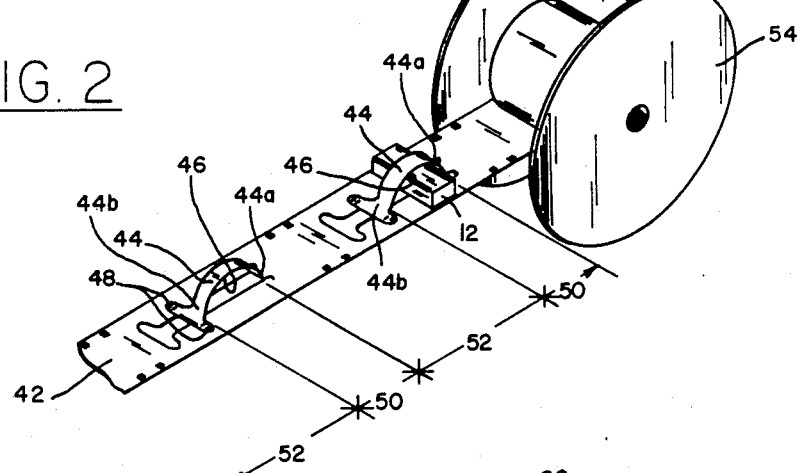
FIG. 2 is a perspective view of another flexible substrate assembly according to the invention shown wound about a reel for transportation.

FIG. 2 shows an alternative embodiment 40 of the substrate assembly, wherein a single sheet of flexible substrate material 42 has straps 44 struck out therefrom to form tubular passageways 46 for containing a continuous succession of solid components 12. Straps 44 have a first end 44a which is joined to the substrate 42 with a living hinge, and a second free end 44b having ears 48 which are joined to substrate 42 by any suitable technique such as ultrasonic welding. As can be seen, substrate 40 is comprised of an alternating succession of first component receiving portions 50 (upon which the solid members are disposed, and which form the lower portion of tubular passageways 46) and second spacer portions 52 which are disposed between the first portions 50. As indicated in FIG. 2, the completed substrate assembly, with components inserted, can be wound about a reel 54, to provide a convenient packaging assembly. When the substrate assembly is unreeled and indexed to a predetermined position adjacent a dispensing work station, actuator arms (such as those shown in FIG. 1) can be utilized to displace and thereby eject solid components 12 from substrate assembly 40, at the desired position.

Figure 3:
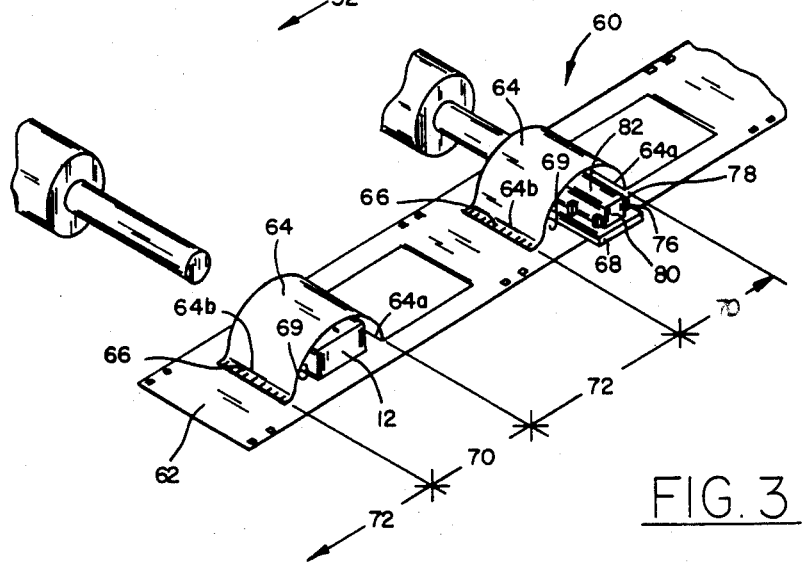
FIGS. 3 and 4 show alternative embodiments of the flexible substrate assembly according to the present invention.

Referring now to FIG. 3, a flexible substrate assembly 60 is shown comprising a sheet of flexible substrate material 62 from which straps 64 are struck in a outward direction by a rolling cutting die or the like conventional apparatus. Straps 64 have a first end 64a joined to substrate 62 with a living hinge, and a second free end 64b which, upon folding flap 64, is joined to substrate 62 by ultrasonic welding, for example, to form a seam 66. As can be seen in FIG. 3, flexible substrate 62 comprises an alternating succession of first portions component receiving 70 forming a portion of tubular passageways 69, for receiving solid members 68, and second spacer portions 72 located between the first portions 70. As shown in the right hand portion of FIG. 3, solid component 68 comprises an electrical connector having a body 74, and plurality of outwardly extending pin-like projections 76 having free ends 78. To prevent damage or misalignment of the terminals 76 during transportation, and to prevent the piercing of straps 64 by those terminals, a rigid spacer member 80 is located adjacent terminals 76, having an upper surface 82 which projects slightly above, or is at a same level are the free ends 78 of terminal 76. When fully assembled, straps 64 will contact spacer member 80, rather than free ends 78 of terminals 76.

Figure 4:
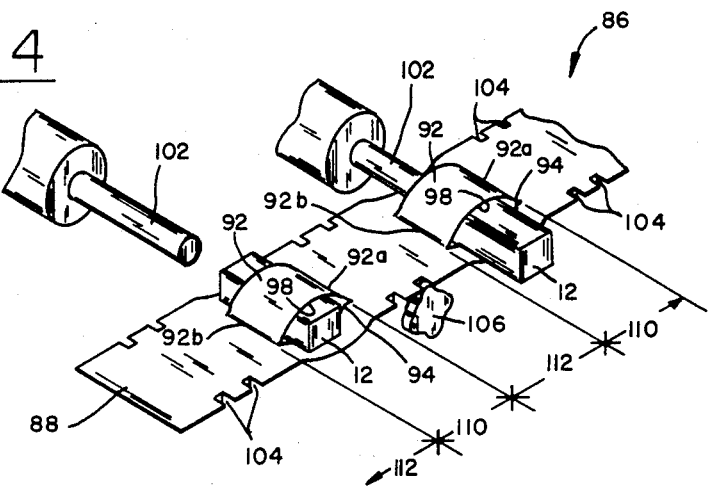

Turning now to FIG. 4, a flexible substrate assembly 86 is comprised of a flexible substrate sheet 88 from which straps 92 are formed by a plurality of spaced apart slits 94. Straps 92 have first and second ends 92a, 92b joined to flexible substrate 88 to form tubular passageways 98 for containing solid components 12. As can be seen in this embodiment, no ultrasonic welding or other bonding is required to join straps 92 to substrate 88. Also shown in FIG. 4 is a positioning work station having actuator arms 102 which enter tubular passageways 94 to displace and thereby eject components 12 from carrier substrate assembly 86, at a predetermined location. Substrate assembly 86 has a plurality of spaced-apart apertures or notches 104 which engage drive wheel 106 to provide advancement of substrate assembly to a desired work station. As can be seen in FIG. 4, flexible substrate 88 comprises an alternating succession of first component receiving portions 110 which form the lower portion of tubular passageways 94 for containing solid components 12, and second spacer portions 112 located between the first portions 110.

Figure 5:
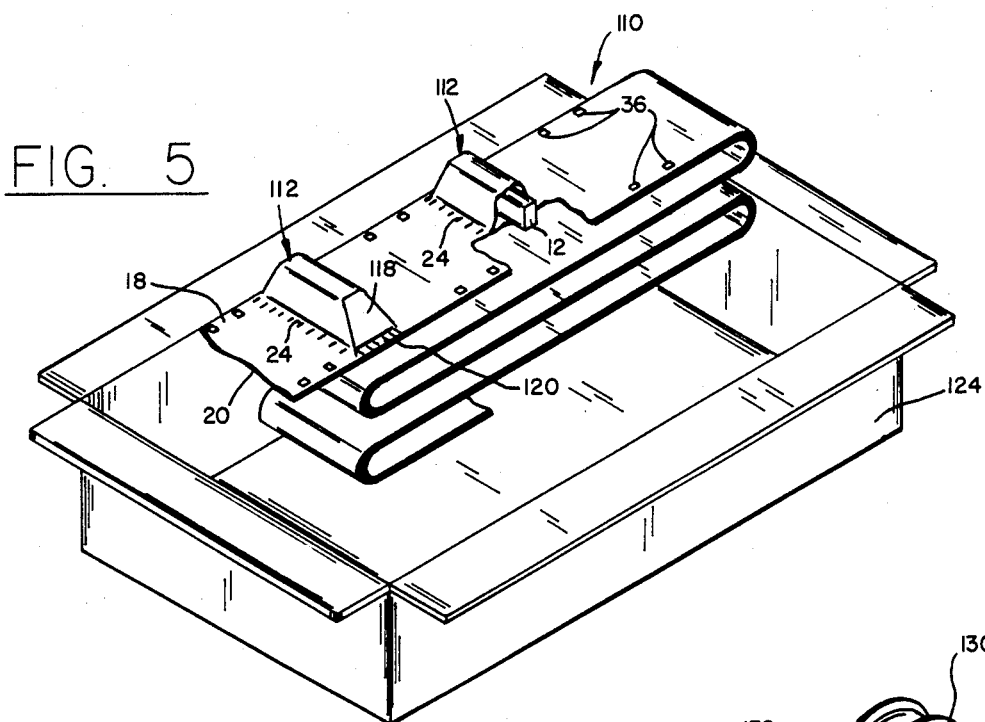
FIG. 5 is a perspective view of a flexible substrate assembly providing substantially enclosed containment of solid components. The substrate is wound in a boustrophedon pattern for ready storage in a box-like shipping container.

Referring now to FIG. 5, a substrate assembly 110 is shown comprising a continuous succession of container portions 112. Substrate assembly 110 is conveniently comprised of the substrate assembly 10 of FIG. 1, wherein the ends of each tubular passageway are closed by joining adjacent edges upper and lower substrate sheets 18, 20 to form a closed end 118. In the preferred embodiment, upper and lower substrate sheets 18, 20 are brought together at their ends, being ultrasonically welded to form a seam 120 at each end of the tubular passageway.

Also shown in FIG. 5 is a packaging arrangement wherein the substrate assembly 110 is laid in a back-and-forth, boustrophedon, or festooned arrangement, for ready containment in a box-like container 124. This packaging arrangement could readily accommodate the other substrate assembly embodiments described herein.

Figure 6:
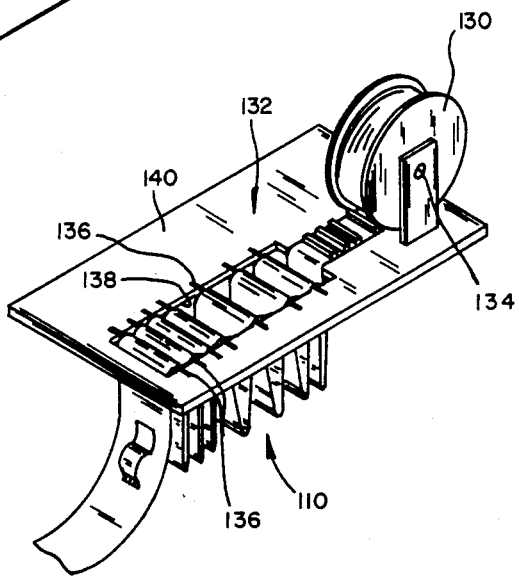
FIG. 6 is a perspective view showing the flexible substrate assembly of the present invention being festooned or folded to form the continuous web of FIG. 5.

FIG. 6 shows a workstation for folding the substrate assembly 110 of FIG. 5. The completed substrate assembly 110 has conveniently been wound onto a takeup reel 130. At folding station 132, the takeup reel 130 is disposed on a removeable reel axis 134, so that the plurality of substrate portions of predetermined length can be draped over moveable fold pins 136 disposed to overlie a rectangular slot 138 in folding station plate 140. The moveable fold pins 136 can be moved away from the reel 130 after the material is draped over pin 136 at regular time intervals, to fold the substrate assembly upon itself in a boustrophedon pattern, generally designated by the numeral 125 in FIG. 5. For this purpose, the substrate is folded such that each layer has a length approximately equal to the length L of box 124 as shown in FIG. 5.

Figure 7A:
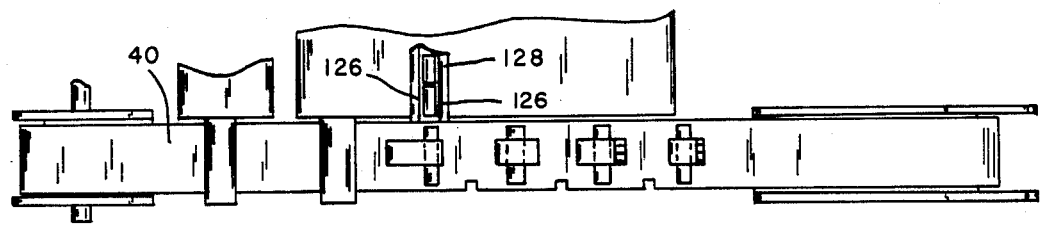
FIGS. 7a, 7b are plan and elevation views of an apparatus for producing the packaging arrangement of FIGS. 2-4.
Figure 7B:
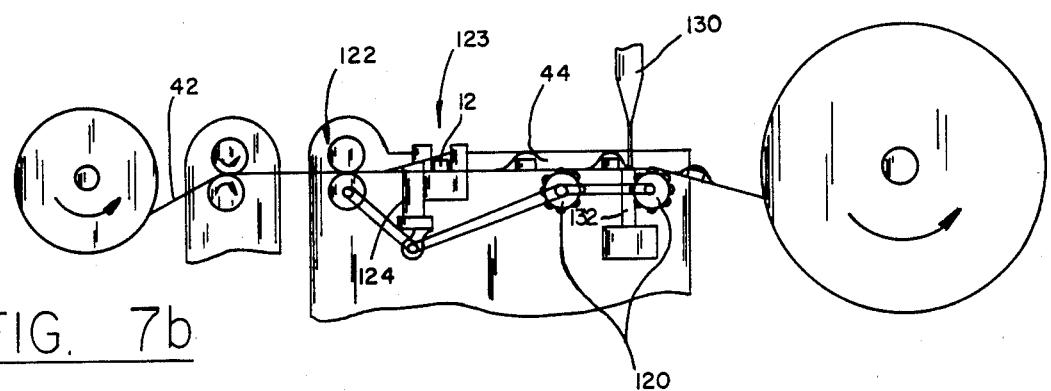

Turning now to FIGS. 7 and 8, a method and apparatus for constructing the aforementioned flexible substrate assemblies will be shown. FIGS. 7a, 7b show a work station for fabricating a flexible substrate assembly of FIGS. 2–4. The flexible substrate assembly 42 of FIG. 2, is advanced from left to right in FIGS. 7a, 7b by cog drive wheels 121 which engage indexing notches or apertures formed in the substrate. As substrate 42 is advanced past a rotary die unit 122, straps 44 are struck from substrate 42, and upon further advancement are located adjacent an insert station 123 where a strap lifter 125 raises strap 44 from the plane of substrate 42, to allow positioning of a component 12, therebetween. Component 12 is transported along exit track 128, by reciprocating loading arms 126. Arms 126, which grasp the connector at either side in a vice-like fashion, are extended so as to be positioned between strap 44 and substrate 42. Substrate assembly 40 is thereafter advanced such that the ears 48 are disposed between ultrasonic welding horn 131 and its related anvil 133 for bonding to substrate 42.

The above method and apparatus also applies to the flexible substrate assemblies shown in FIGS. 3 and 4. However, the ultrasonic welding position is not required for the connector assembly 86 of FIG. 4. After its formation in rotary die 122, the strap 92 of FIG. 4 is raised at station 124 and solid member 100 is inserted in tubular passageway 94.

Figure 8A:
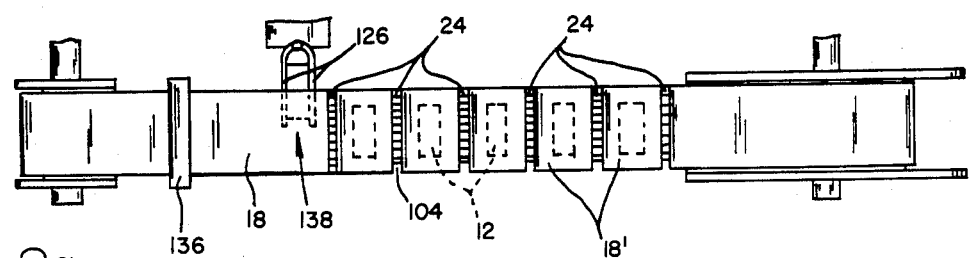
FIGS. 8a, 8b are plan and elevation views of an apparatus for producing the packaging arrangement of FIG. 1.
Figure 8B:
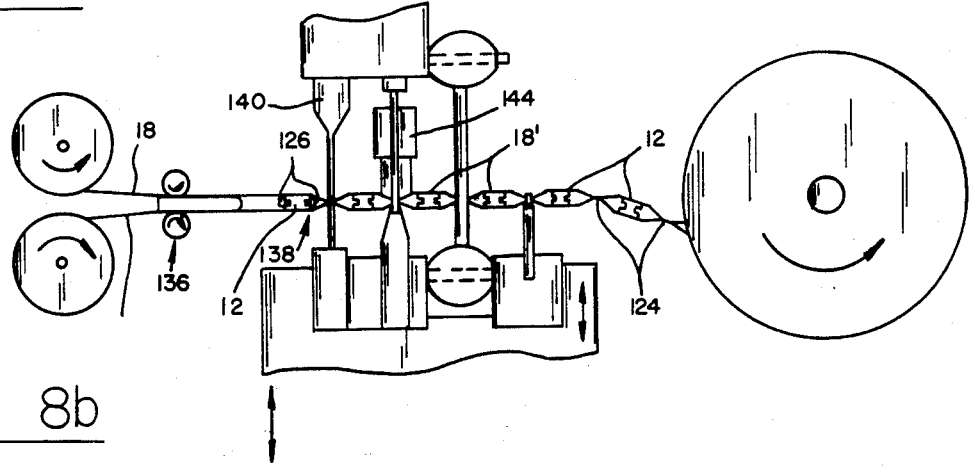

Turning now to FIGS. 8a, 8b a fabrication station similar to that of FIGS. 7a, 7b is shown, for fabricating the flexible substrate assembly 10 of FIG. 1. Upper and lower substrate sheets 18, 20 are advanced by feed roller 137 to an insertion station 139 where solid component 12 is spatially oriented by the insertion arms 126 of a shuttle insertion mechanism, similar to that of FIGS. 7a, 7b. Thereafter, upper and lower flexible substrate sheets 18, 20 are joined together by ultrasonic welding horn 141, which joins a first side or tubular passageway 14. Whereafter, flexible substrate sheets 18, 20 are advanced so that the other seam 24 of tubular passageway 14 can be formed at the same welding station 140. Drive notches are formed in the substrate assembly at notching die station 144 which lances and drifts the notched portions. Thereafter, flexible substrate assembly 10 is located at a pickup reel or a folding work station such as the work station 132 of FIG. 6.

Figure 9B:
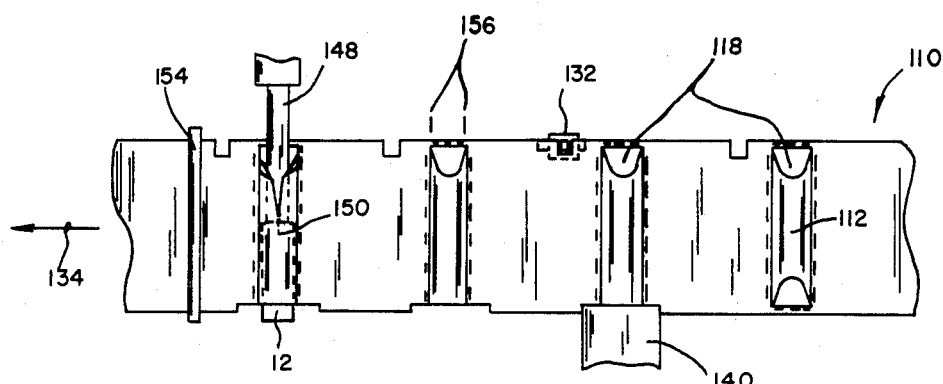
FIGS. 9a, 9b show plan views of two arrangements for dispensing solid members contained in the packaging arrangement of FIG. 5.
Figure 9A:
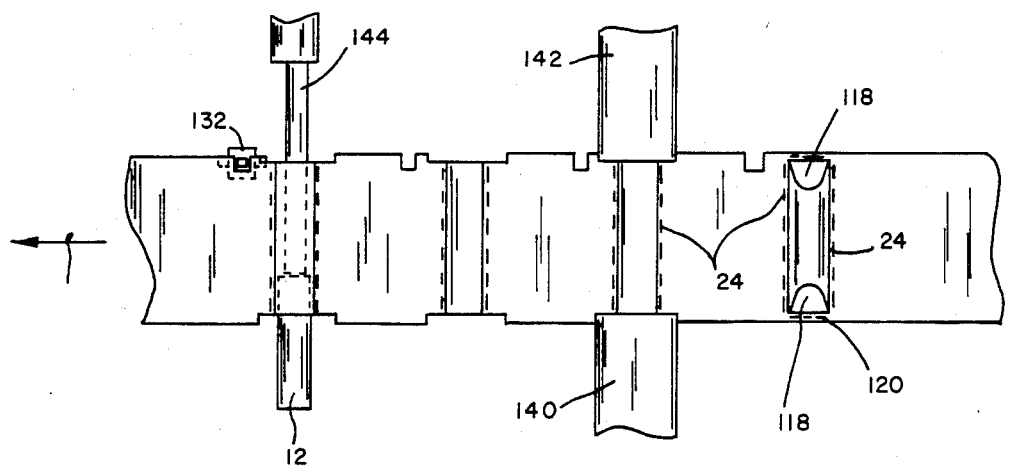

Turning now to FIGS. 9a, 9b two work station embodiments for removing solid components from the flexible substrate assembly 110 of FIG. 5 are shown. Each work station includes a drive means 152 for advancing the flexible substrate assembly 110 in predetermined amounts in the direction of arrow 154. FIG. 9a shows notching blades 160, 162 for notching or slitting the edges of flexible substrate assembly 110 so as to open each end 118 of containing portions 112. Thereafter, an actuator arm 164 such as that shown in FIGS. 1, 3 or 4 can be employed to eject component 12 from the flexible substrate assembly.

FIG. 9b shows an alternative arrangement for ejecting the solid members, wherein only one side of the container is notched by notching blade 160. The opposing closed end of the container is pierced by an actuator arm 168 which contains a knife blade tip 170 for slitting the upper portion of container cavity 112. As actuator arm 168 enters the container portion 112, component 12 is displaced and thereby ejected. An alternative method of dispensing component 12 is indicated by knife blade 174 which slits or opens one side of container portion 112 by cutting just inside the welded seam portion 24, along dotted lines 176 as shown in FIG. 9b.

Although the method of forming the flexible substrate packaging assembly has included the formation of the flexible substrate around a spatially positioned component, it will be readily appreciated by those skilled in the art that (with the exception of the substantially enclosed containers of FIG. 5,) the flexible substrate could be formed first, with the solid member being thereafter inserted. For example, in the arrangement of FIG. 1, flexible substrate sheets 18, 20 could be bonded together to form tubular passageways 14, whereupon the flexible substrate carrier thus formed would be stored in a convenient manner, such as on a reel or folded in a boustrophedon pattern for storage in a box. Thereafter, the carrier assembly could be extracted and solid members inserted within the tubular passageways.

It will also be appreciated by those skilled in the art that the relative length of the strap and substrate first portions in each of the embodiments set forth above, need not be of equal length. For example, the straps could be longer than the first portions of the substrate which they adjoin.

In each of the embodiments described above, the solid component can be readily ejected from either end of the tubular passageway. This is an important feature when the solid components having axes of symmetry that give the components a "reversible" configuration, depending upon the end of the component considered.

I claim:

1. An apparatus for making a flexible substrate assembly which includes
   an elongated flexible substrate having a plurality of spaced apart component-receiving regions, a plurality of solid components disposed on said substrate, one on each region, and
   a plurality of pairs of aligned spaced-apart generally longitudinally extending slits formed in said substrate, each defining flexible strap means having one end adjacent each region on one side thereof and a second end adjacent the opposite side of said region, integrally joined by connection portions overlying said regions to form a tube-like passageway for receiving and containing said components, the apparatus comprising
   a work station whereat said assembly is made;
   means for presenting the substrate to the work station;
   means for cutting the substrate to form said strap means;
   means for lifting said strap means from said substrate to provide entry into said component-receiving passageway;
   means for inserting said component between said strap means and said substrate wherein said cutting means cuts the second end of said strap means free of said substrate, said apparatus further comprising means for joining the free end of said strap means to said substrate to form said tube-like passageway.

2. The apparatus of claim 1 wherein said cutting means is operative to strike out the connecting portion of said strap means from said component receiving region leaving an opening therein, with the second end of said strap means having a free end with laterally extending ears; and said joining means is operable to join the ears of said free end to said substrate on either side of said opening.

3. The apparatus of claim 1 wherein said cutting means is operative to strike out the connecting portion of said strap means from said component receiving region, leaving an opening therein, and said lifting means is operative to bend the connecting portion away from the opening, to form a tube-like passageway logitudinally adjacent said opening.

* * * * *